(12) United States Patent
Chien et al.

(10) Patent No.: US 6,368,971 B2
(45) Date of Patent: *Apr. 9, 2002

(54) METHOD OF MANUFACTURING BOTTOM ELECTRODE OF CAPACITOR

(75) Inventors: Sun-Chieh Chien; Chien-Li Kuo, both of Hsinchu; Wei-Wu Liao, Taipei Hsien, all of (TW)

(73) Assignee: United Microelectronics Corp., Hsinchu City (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/348,408
(22) Filed: Jul. 7, 1999
(51) Int. Cl.[7] ............................................. H01L 21/302
(52) U.S. Cl. ..................... 438/691; 438/706; 438/697; 438/723; 438/724
(58) Field of Search ................................ 438/386, 393, 438/394, 396, 397, 398, 399, 691, 697, 706, 723, 745, 756

(56) References Cited

U.S. PATENT DOCUMENTS

| | | | |
|---|---|---|---|
| 5,580,812 A | * 12/1996 | Ikemasu et al. | 437/52 |
| 5,869,382 A | * 2/1999 | Kubota | 438/396 |
| 5,895,250 A | * 4/1999 | Wu | 438/396 |
| 5,937,294 A | * 8/1999 | Sandhu et al. | 438/398 |
| 5,985,732 A | * 11/1999 | Fazan et al. | 438/398 |
| 6,037,234 A | * 3/2000 | Hong et al. | 438/396 |

* cited by examiner

Primary Examiner—Benjamin L. Utech
Assistant Examiner—Duy-Vu Deo
(74) Attorney, Agent, or Firm—Thomas, Kayden, Horstemeyer & Risley

(57) ABSTRACT

A method of manufacturing a bottom electrode of a capacitor. A substrate has a contact pad formed thereon, a first dielectric layer is formed on the contact pad, and a node contact penetrates through the first dielectric layer and electrically couples to the contact pad. A second dielectric layer is formed on the first dielectric layer and the node contact. A third dielectric layer is formed on the second dielectric layer. A fourth dielectric layer is formed on the third dielectric layer. A trench is formed to penetrate through the fourth, the third and the second dielectric layer and to expose a surface of the node contact. A conductive layer is formed on the fourth dielectric layer and a sidewall and a bottom of the trench. A fifth dielectric layer is formed on the conductive layer, wherein the fifth dielectric layer fills the trench. A portion of the fifth dielectric layer and a portion of the conductive layer are removed until a surface of the fourth dielectric layer is exposed. The remaining fifth dielectric layer and the fourth dielectric layer are removed.

19 Claims, 3 Drawing Sheets

METHOD OF MANUFACTURING BOTTOM ELECTRODE OF CAPACITOR

BACKGROUND OF THE INVENTION

1. Field of Invention

The present invention relates to a method of manufacturing a semiconductor device. More particularly, the present invention relates to a method of manufacturing a bottom electrode of a capacitor.

2. Description of Related Art

Dynamic random access memory (DRAM) is applied broadly in the field of integrated circuits devices, and more importantly, in the electronics industry. DRAMs with higher capacitance are necessary for the development of the industry. In order to simplify the circuit constitution and to increase the density of the device, the conventional memory cell composed of three transistors is replaced by a current memory cell which is composed of a transistor series-coupled to a capacitor.

The capacitor is used to store charges that are digital data. The more the capacitance is, the less the loss of digital data is. In addition to increasing the dielectric constant of the capacitor dielectric layer and decreasing the thickness of the capacitor dielectric layer, the area of the capacitor is increased to enhance the capacitance.

FIG. 1A is schematic, cross-sectional view of a conventional bottom electrode of a DRAM capacitor. As shown in FIG. 1, the method of manufacturing a bottom electrode 114 comprises forming a dielectric layer 106 over a substrate 100 including a dielectric layer 102 and a contact pad 104. The contact pad 104 is electrically coupled to a source/drain region (not shown) formed in the substrate 100. After that, bit lines 108 and a dielectric layer 110 are formed on the dielectric layer 106 in sequence, wherein the dielectric layer 110 fills the spaces between the bit lines 108 and covers the bit lines 108. Thereafter, a photolithography and etching process is performed to define the dielectric layers 108 and 106 and to form a node contact hole 112. The node contact hole 112 penetrates through the dielectric layers 108 and 106 and exposes a portion of the contact pad 104. Then, a polysilicon layer (not shown) is formed over the substrate 100 and fills the node contact hole 112. After that, a portion of the polysilicon layer is removed until the surface of the dielectric layer 108 is exposed and a node contact 112a is formed in the node contact hole 112. A polysilicon layer (not shown) is formed over the substrate 100. A polysilicon photolithography and etching process is performed to form a bottom electrode 114 electrically coupled to the contact pad 104 through the node contact 112a.

Since it is difficult to control the polysilicon photolithography and etching process, polysilicon material easily remains on the surface of the dielectric layer 110, which leads to the problem of a short in the capacitor. Moreover, the cross-sectional area of the bottom electrode 114 decreases from the top of the bottom electrode 114 to the bottom of the bottom electrode 114 (as shown in FIG. 1) because the polysilicon photolithography and etching process is difficult to control. Therefore, the bottom electrode will collapse in the subsequent manufacturing process.

SUMMARY OF THE INVENTION

The invention provides a method of manufacturing a bottom electrode of a capacitor. A substrate is provided. The substrate has a contact pad formed thereon, a first dielectric layer formed on the contact pad, and a node contact penetrating through the first dielectric layer and electrically coupled to the contact pad. A second dielectric layer is formed on the first dielectric layer and the node contact. A third dielectric layer is formed on the second dielectric layer. A fourth dielectric layer is formed on the third dielectric layer. A trench is formed to penetrate through the fourth, the third and the second dielectric layer and to expose a surface of the node contact. A conductive layer is formed on the fourth dielectric layer and a sidewall and a bottom of the trench. A fifth dielectric layer is formed on the conductive layer, wherein the fifth dielectric layer fills the trench. A portion of the fifth dielectric layer and a portion of the conductive layer are removed until a surface of the fourth dielectric layer is exposed. The remaining fifth dielectric layer and the fourth dielectric layer are removed.

As embodied and broadly described herein, the invention provides a method of manufacturing a bottom electrode of a capacitor. Since the thickness of the fourth dielectric layer can be varied with the height of the bottom electrode, the structure of the bottom electrode is relatively firm. Therefore, the invention can overcome the problem of the bottom electrode collapsing. Incidentally, in the invention, because the trench is formed in the fourth dielectric layer before the conductive layer is formed, it is unnecessary to perform the polysilicon photolithography and etching process. Hence, the problem due to the difficult-to-control polysilicon photolithography and etching process can be overcome.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A through 2E are schematic, cross-sectional views of the process for manufacturing a bottom electrode of a capacitor in a preferred embodiment according to the invention.

Figure 1:
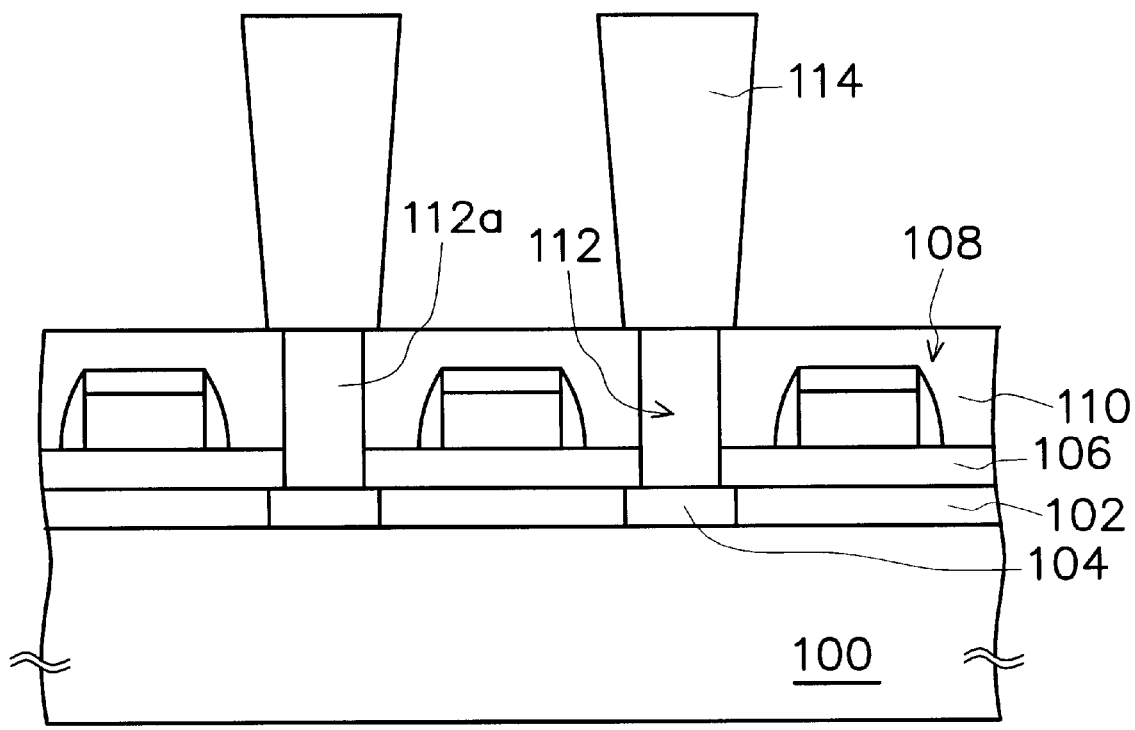
FIG. 1A is schematic, cross-sectional view of a conventional bottom electrode of a DRAM capacitor.
Figure 2A:
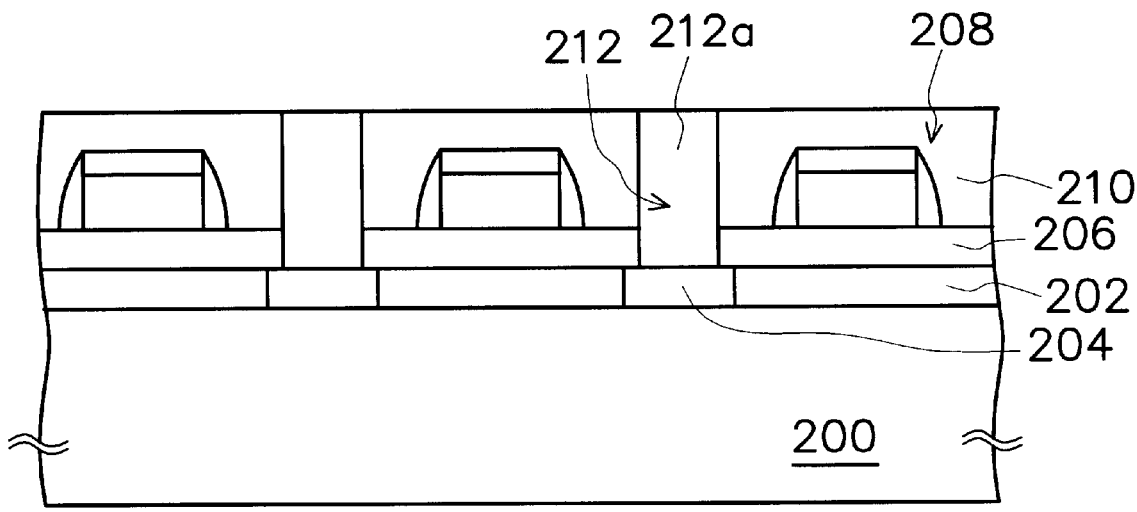
FIGS. 2A through 2E are schematic, cross-sectional views of the process for manufacturing a bottom electrode of a capacitor in a preferred embodiment according to the invention.

As shown in FIG. 2A, a substrate 200 having semiconductor devices (not shown) formed therein is provided, wherein the semiconductor devices comprise isolation regions, source/drain region and gate structure. The substrate 200 further comprises a dielectric layer 202 including contact pads 204, a dielectric layer 206, bit lines 208 and a dielectric layer 210 filling the spaces between the bit lines 208. The contact pads 204 are electrically coupled to the source/drain region in the substrate 200. The dielectric layer 210 can be formed from silicon oxide by chemical vapor deposition, for example. A node contact hole 212 is formed to penetrate through the dielectric layers 210 and 206 and exposes a portion of the contact pad 204. A node contact 212a is formed in the node contact hole 212 and fills the node contact hole 212. The node contact 212a is electrically coupled to the source/drain region (not shown) through the contact pad 204. The method of forming the node contact 212a comprises forming a conductive layer (not shown) over the substrate 200, wherein the conductive layer fills the node contact hole 212. A portion of the conductive layer is removed until the surface of the dielectric layer 210 is exposed. The method of removing a portion of the conductive layer can be chemical-mechanical polishing (CMP) or etching back, for example. The material of the node contact 212a can be polysilicon, for example.

Figure 2B:
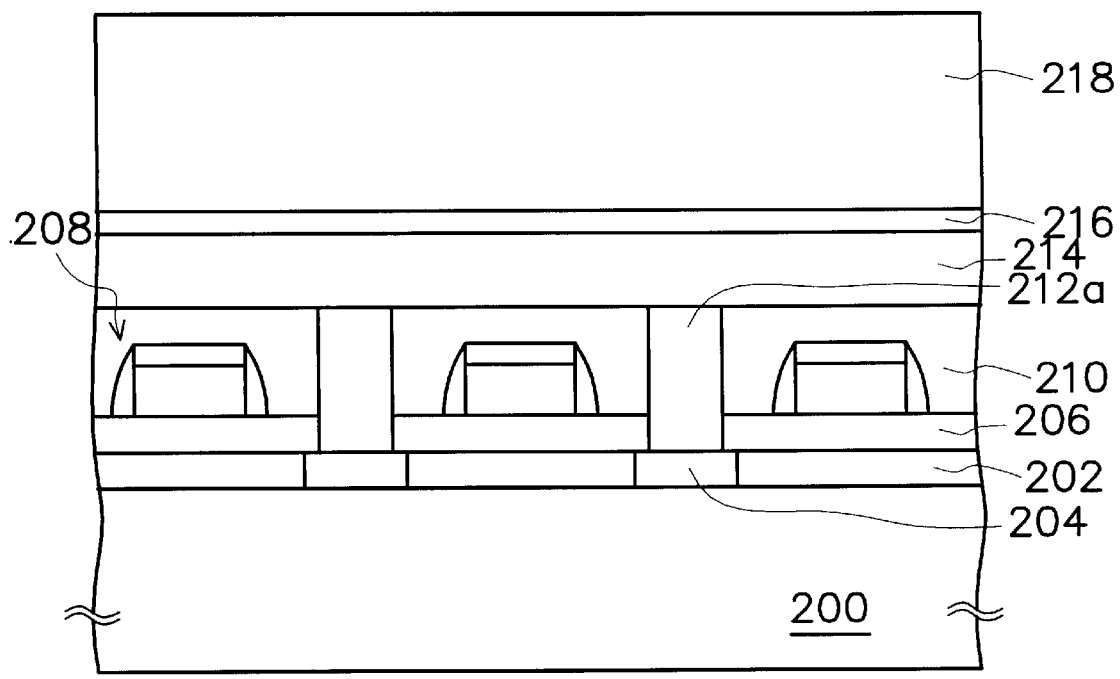

As shown in FIG. 2B, dielectric layers 214, 216 and 218 are formed on the dielectric layer 210 and the node contact 212a in sequence. The dielectric layer 214 can be formed from silicon oxide by CVD. Preferably, the method of forming the dielectric layer 214 includes low pressure chemical vapor deposition (LPCVD) or plasma-enhanced chemical vapor deposition (PECVD). Moreover, the thickness of the dielectric layer 214 can be varied with the height of the subsequently formed bottom electrode. The dielectric layer 216 serves as a mask layer in subsequent etching process. Additionally, the dielectric layer 216 can be formed from silicon nitride by LPCVD or PECVD and the thickness of the dielectric layer 216 is about 200–500 angstroms, for example. Preferably, the thickness of the dielectric layer 216 is about 300 angstroms. Furthermore, the etching rate of the dielectric layer 218 is different from that of the dielectric layer 216, and the dielectric layer 218 can be formed from silicon oxide by CVD, for example. Preferably, the method of forming the dielectric layer 218 comprises LPCVD or PECVD.

Figure 2C:
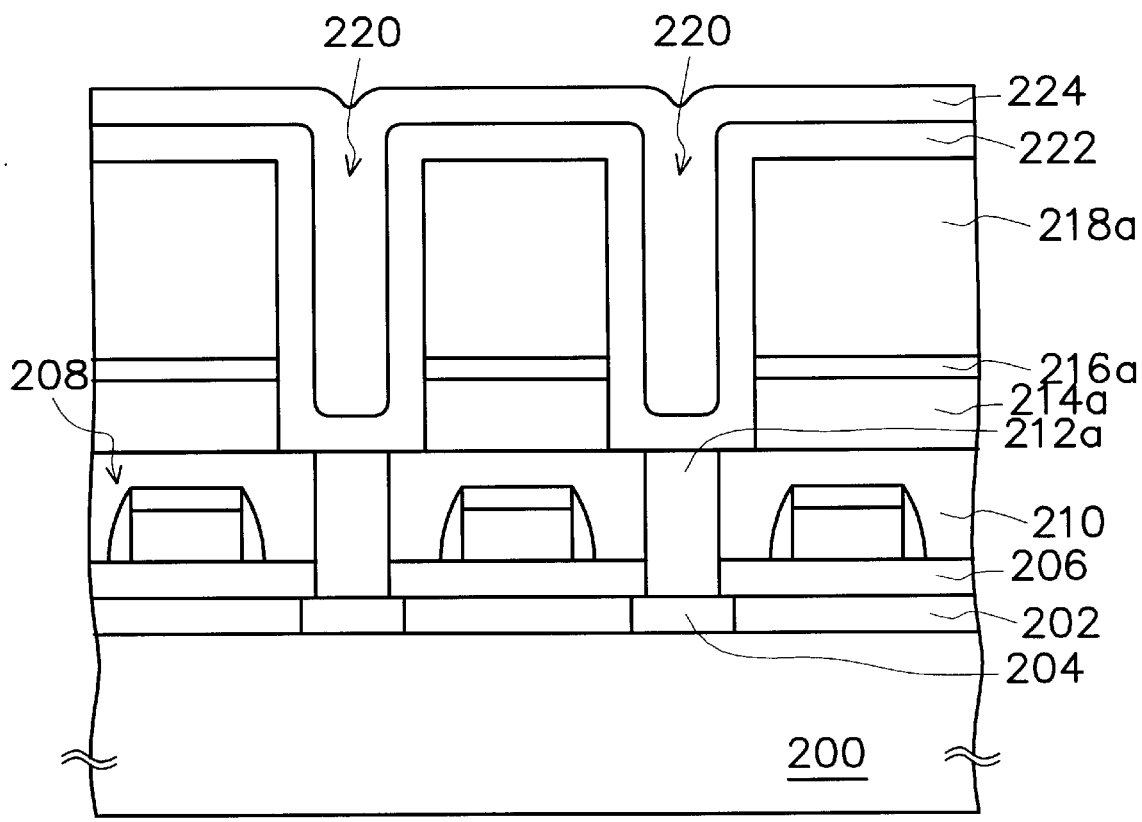

As shown in FIG. 2C, the dielectric layers 218, 218 and 214 are patterned to form a trench 220 penetrating through the dielectric layers 218, 216 and 214. The dielectric layers 218, 216 and 214 penetrated through by the trench 220 are respectively denoted as dielectric layers 218a, 216a and 214a. The trench 220 exposes the surface of the node contact 212 and a portion of the dielectric layer 210. A conductive layer 222 is formed on the dielectric layer 218a, the sidewall and the bottom surface of the trench 220. The conductive layer 222 can be formed from polysilicon by CVD, for example. A dielectric layer 224 is formed on the conductive layer 222 and fills the trench 220. The dielectric layer 220 can be formed from silicon oxide by CVD, for example.

Figure 2D:
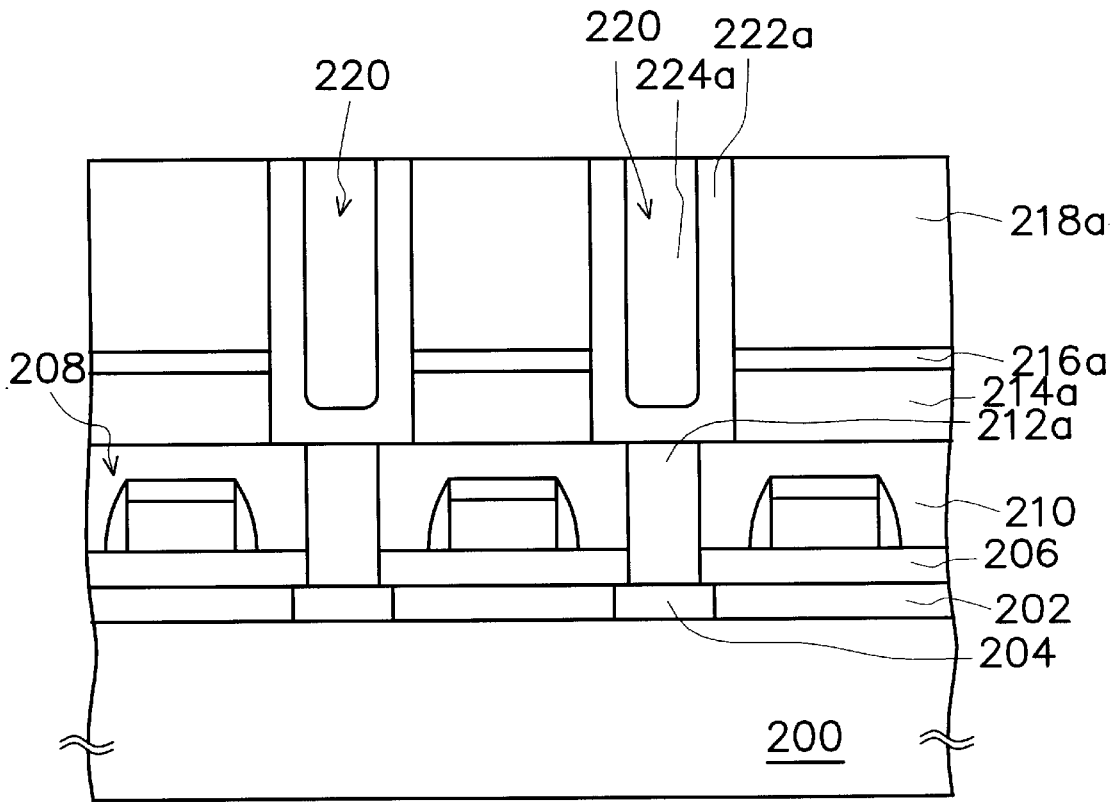

As shown in FIG. 2D, a portion of the conductive layer 222 and a portion of the dielectric layer 224 are removed until the surface of the dielectric layer 218a is exposed. Hence, the remaining conductive layer 222 and the remaining dielectric layer 224 are respectively denoted as a conductive layer 222a and a dielectric layer 224a. The method of removing the portion of the conductive layer 222 and the portion of the dielectric layer 224 can be CMP or etching back, for example.

Figure 2E:
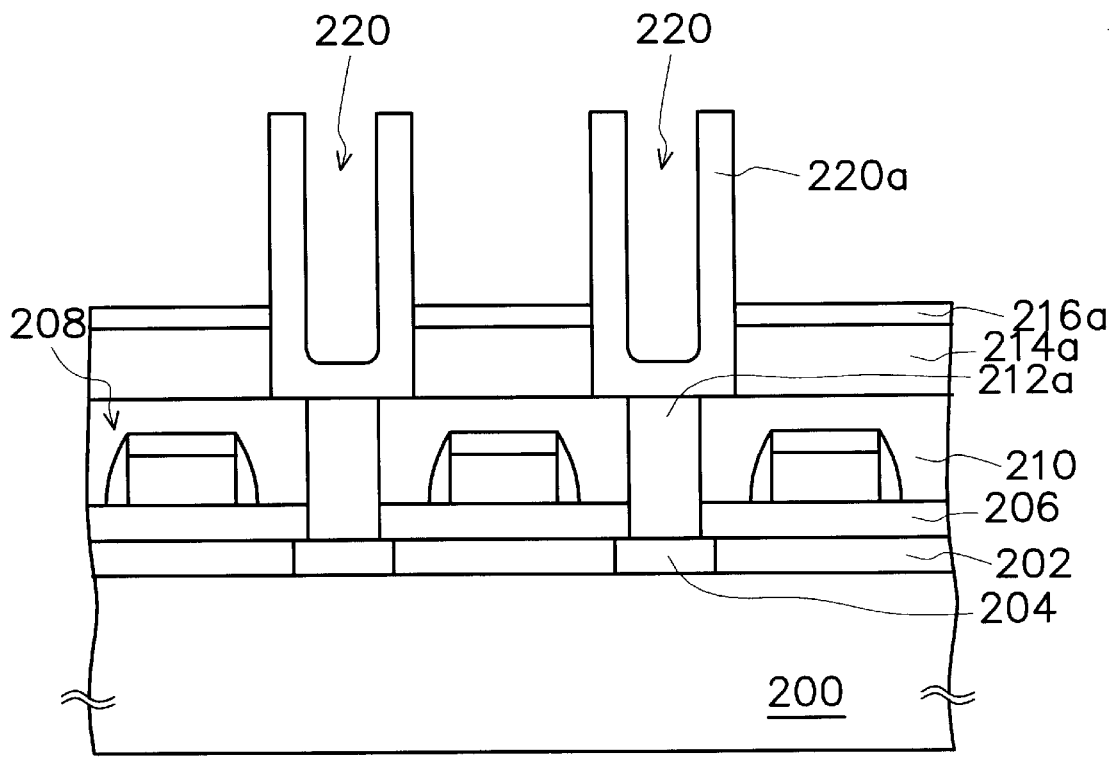

As shown in FIG. 2E, the dielectric layers 218a and 224a are removed, with the dielectric layer 216a serving as a mask layer, until a portion of the conductive layer 220a located at the bottom of the trench 220 is exposed. The conductive layer 222a forms a crown-type bottom electrode of a capacitor. The crown-type bottom electrode is electrically coupled to the source/drain region in the substrate 200 through the node contact 212 and contact pad 204. The method of removing the dielectric layers 218a and 224a can be dry etching or wet etching, for example. In the invention, the crown-type bottom electrode is formed without performing the polysilicon photolithography and etching process, so that the problem of the short caused by the polysilicon remaining on the dielectric layer after the difficult-to-control polysilicon photolithography and etching process is performed can be overcome.

After the crown-type bottom electrode is formed, the subsequent manufacturing processes, such as the performance of the hemispherical grained process and the formations of the capacitor dielectric film and upper electrode, are performed to finish the formation of the capacitor of a DRAM. The subsequent manufacturing processes are well known by people skilled in the art, so that those processes will not be further described here.

Since the thickness of the dielectric layer 214a can be varied with the height of the bottom electrode, the structure of the bottom electrode is relatively firm. Therefore, the invention can overcome the problem of the bottom electrode collapsing caused by the cross-sectional area of the bottom of the bottom electrode being smaller than that of the upper the bottom electrode. Incidentally, in the invention, because the trench is formed in the dielectric layer before the bottom electrode is formed, it is unnecessary to perform the polysilicon photolithography and etching process. Hence, the problem of polysilicon remaining on the dielectric layer due to the difficult-to-control polysilicon photolithography and etching process can be overcome. Furthermore, the surface area of the bottom electrode in the invention is larger than that of the conventional bottom electrode, so that the capacitance can be greatly increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a bottom electrode of a capacitor formed on a substrate, the substrate having a contact pad formed thereon, a first dielectric layer formed on the contact pad, and a node contact penetrating through the first dielectric layer and electrically coupled to the contact pad, the method comprising the steps of:

forming a second dielectric layer on the first dielectric layer and the node contact;

forming a third dielectric layer on the second dielectric layer;

forming a fourth dielectric layer on the third dielectric layer;

patterning the fourth, the third and the second dielectric layers for forming a trench in the fourth, the third and the second dielectric layers to expose a surface of the node contact, wherein the trench is formed after the node contact is formed;

forming a conductive layer on the fourth dielectric layer for covering a sidewall and a bottom of the trench;

forming a fifth dielectric layer on the conductive layer, wherein the fifth dielectric layer fills the trench;

removing a portion of the fifth dielectric layer and a portion of the conductive layer until a surface of the fourth dielectric layer is exposed; and removing the remaining fifth dielectric layer and the fourth dielectric layer.

2. The method of claim 1, wherein the etching rate of the third dielectric layer is different from that of the fourth dielectric layer.

3. The method of claim 1, wherein the third dielectric layer can be made of silicon nitride.

4. The method of claim 1, wherein the step of forming the third dielectric layer includes chemical vapor deposition.

5. The method of claim 1, wherein the third dielectric layer is about 300 angstroms thick.

6. The method of claim 1, wherein the fourth dielectric layer can be made of silicon oxide.

7. The method of claim 1, wherein the step of forming the fourth dielectric layer includes chemical vapor deposition.

8. The method of claim 1, wherein the step of removing the portion of the fifth dielectric layer and the portion of the conductive layer includes chemical-mechanical polishing.

9. The method of claim 1, wherein the step of removing the remaining fifth dielectric layer and the fourth dielectric layer includes dry etching.

10. The method of claim 1, wherein the step of removing the remaining fifth dielectric layer and the fourth dielectric layer includes wet etching.

11. A method of manufacturing a bottom electrode of a capacitor formed on a substrate, the substrate having a contact pad formed thereon, a first dielectric layer formed on the contact pad, and a node contact penetrating through the first dielectric layer and electrically coupled to the contact pad, the method comprising the steps of:

forming a second dielectric layer, a mask layer and a third dielectric layer on the first dielectric layer and the node contact in sequence;

forming a trench in the third dielectric layer, the mask layer and the second dielectric layer to expose a surface of the node contact, wherein the trench is formed after the node contact is formed;

forming a conductive layer on a sidewall and a bottom of the trench and forming a fourth dielectric layer on the conductive layer, wherein the fourth dielectric layer fills the trench; and removing the fourth dielectric layer and the third dielectric layer.

12. The method of claim 11, wherein the etching rate of the mask layer and the third dielectric layer have different etching rates.

13. The method of claim 11, wherein the step of forming the mask layer includes chemical vapor deposition.

14. The method of claim 11, wherein the third dielectric layer is about 300 angstroms thick.

15. The method of claim 11, wherein the third dielectric layer can be made of silicon oxide.

16. The method of claim 11, wherein the step of forming the third dielectric layer includes chemical vapor deposition.

17. The method of claim 11, wherein the step of removing the fourth dielectric layer and the third dielectric layer includes dry etching.

18. The method of claim 11, wherein the step of removing the fourth dielectric layer and the third dielectric layer includes wet etching.

19. A method of manufacturing a bottom electrode of a capacitor formed on a substrate, the substrate having a contact pad formed thereon, a first dielectric layer formed on the contact pad, and a node contact penetrating through the first dielectric layer and electrically coupled to the contact pad, the method comprising the steps of:

forming a second dielectric layer on the first dielectric layer and the node contact;

forming a third dielectric layer on the second dielectric layer;

forming a fourth dielectric layer on the third dielectric layer;

forming a trench through the fourth, the third, and the second dielectric layers to expose the node contact;

forming a conductive layer over the substrate, wherein the conductive layer is conformal to the trench;

forming a fifth dielectric layer on the conductive layer, wherein the fifth dielectric layer fills the trench;

removing a portion of the fifth dielectric layer and a portion of the conductive layer until a surface of the fourth dielectric layer is exposed; and removing the remaining fifth dielectric layer and the fourth dielectric layer.

* * * * *